(12) United States Patent
Cho

(10) Patent No.: US 11,076,249 B2
(45) Date of Patent: Jul. 27, 2021

(54) ELECTRONIC DEVICE AND CONTROL METHOD THEREOF

(71) Applicant: SAMSUNG ELECTRONICS CO., LTD., Suwon-si (KR)

(72) Inventor: Hyeungrae Cho, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/660,995

(22) Filed: Oct. 23, 2019

(65) Prior Publication Data
US 2020/0145770 A1 May 7, 2020

(30) Foreign Application Priority Data
Nov. 7, 2018 (KR) .................. 10-2018-0136002

(51) Int. Cl.
H03G 5/00 (2006.01)
H04R 29/00 (2006.01)
H04R 1/02 (2006.01)
H04R 3/04 (2006.01)
G06F 3/16 (2006.01)
H03G 7/06 (2006.01)
(Continued)

(52) U.S. Cl.
CPC ........... *H04R 29/001* (2013.01); *G06F 3/165* (2013.01); *H01L 23/467* (2013.01); *H03G 7/06* (2013.01); *H04R 1/025* (2013.01); *H04R 3/04* (2013.01); *H03F 3/187* (2013.01); *H03F 2200/03* (2013.01); *H03F 2200/165* (2013.01); *H03F 2200/171* (2013.01); *H03F 2200/468* (2013.01); *H04R 2201/028* (2013.01)

(58) Field of Classification Search
CPC ........ H04R 29/001; H04R 1/025; H04R 3/04; H04R 2201/028; G06F 3/165; H01L 23/467; H03G 7/06; H03F 3/187; H03F 2200/03; H03F 2200/165; H03F 2200/171; H03F 2200/468
USPC ..................................... 381/98, 97
See application file for complete search history.

(56) References Cited

U.S. PATENT DOCUMENTS 6,405,794 B1  6/2002  Kim et al.
8,033,324 B2  10/2011  Mukasa et al.
(Continued)

FOREIGN PATENT DOCUMENTS

JP  2000-107692 A   4/2000
JP      3359480 B2  12/2002
(Continued)

OTHER PUBLICATIONS

International Search Report issued from the International Bureau in counterpart International Application No. PCT/KR2019/013955 dated Feb. 20, 2020 (PCT/ISA/210).
(Continued)

*Primary Examiner* — Ammar T Hamid
(74) *Attorney, Agent, or Firm* — Sughrue Mion, PLLC

(57) ABSTRACT

An electronic device is provided. The electronic device includes an integrated circuit (IC); a sonic vibrator arranged on one side of the IC; a speaker; and a processor configured to: control the speaker based on a sound signal, and filter a low-frequency band signal that is less than or equal to a threshold frequency from the sound signal and provide the low-frequency band signal to the sonic vibrator.

20 Claims, 13 Drawing Sheets

(51) Int. Cl.
    *H01L 23/467*     (2006.01)
    *H04R 1/40*     (2006.01)
    *H03F 3/187*     (2006.01)

(56) References Cited

U.S. PATENT DOCUMENTS

| | | | |
|---|---|---|---|
| 9,592,523 | B2 | 3/2017 | Wetzel et al. |
| 2005/0121171 | A1 | 6/2005 | Mukasa et al. |
| 2007/0169992 | A1 | 7/2007 | Wasif et al. |
| 2007/0268069 | A1* | 11/2007 | Kang .................. H03F 3/387 |
| | | | 330/10 |
| 2018/0139538 | A1* | 5/2018 | Macours .................. H04R 3/04 |
| 2019/0334034 | A1* | 10/2019 | Jackson .............. H01L 29/1033 |

FOREIGN PATENT DOCUMENTS

| | | |
|---|---|---|
| JP | 2004-28389 A | 1/2004 |
| JP | 2009-231701 A | 10/2009 |
| KR | 20010003358 A | 1/2001 |
| KR | 10-0296071 B1 | 7/2001 |
| KR | 10-2004-0002021 A | 1/2004 |
| KR | 1020050043676 A | 5/2005 |
| KR | 100756049 B1 | 9/2007 |
| KR | 10-0881341 B1 | 2/2009 |
| KR | 10-1120465 B1 | 2/2012 |
| WO | 2014052242 A2 | 4/2014 |

OTHER PUBLICATIONS

Written Opinion issued from the International Bureau in counterpart International Application No. PCT/KR2019/013955 dated Feb. 20, 2020 (PCT/ISA/237).

* cited by examiner

US 11,076,249 B2

ELECTRONIC DEVICE AND CONTROL METHOD THEREOF

CROSS-REFERENCE TO RELATED APPLICATION

This application is based on and claims priority under 35 U.S.C. § 119(a) to Korean Patent Application No. 10-2018-0136002, filed on Nov. 7, 2018, in the Korean Intellectual Property Office, the disclosure of which is incorporated by reference herein in its entirety.

BACKGROUND

1. Field

The disclosure relates to an electronic device and a control method thereof and, more particularly, to an electronic device for outputting a sound signal and a control method thereof.

2. Description of Related Art

Cooling performance of a high-density and highly-integrated electronic device has been a subject of continued research and development for the last few decades.

In order to improve heat dissipation performance of an electronic device that includes a plurality of heat generating components therein, such as a television (TV), computer, or communication equipment, there has been used a method for enhancing mixture of cooling fluid by increasing the flow rate of the cooling fluid using a cooling fan or a pump, or inserting a turbulence promoting material to transit the flow from laminar flow to turbulence. However, there are problems in terms of reliability of an operation and in that noise is generated, and the volume of an electronic device is increased.

SUMMARY

One or more embodiments may address the above problems, and may provide an electronic device for performing a heat dissipation function for a main board using an output sound signal and a control method thereof.

In accordance with an aspect of the disclosure, there is provided an electronic device including: an integrated circuit (IC); a sonic vibrator arranged on one side of the IC; a speaker; and a processor configured to: control the speaker based on a sound signal, and filter a low-frequency band signal that is less than or equal to a threshold frequency from the sound signal and provide the low-frequency band signal to the sonic vibrator.

The processor may include: a low pass filter configured to filter the low-frequency band signal from the sound signal; and an amplifier to amplify the low-frequency band signal.

The electronic device may further include a sound amplifier configured to generate an amplified sound signal based on the sound signal, and the processor may be further configured to provide the amplified sound signal to the speaker and the low pass filter.

The processor may be further configured to control an amplification factor of the sound amplifier according to a volume adjustment command of a user, and a level of the low-frequency band signal may be identified based on the amplification factor of the sound amplifier.

The electronic device may further include a temperature sensor arranged on one side of the IC, and the processor may be further configured to control an amplification factor of the amplifier based on temperature information generated by the temperature sensor.

The sonic vibrator may be spaced apart from the IC by a predetermined distance in a first direction.

The sonic vibrator may include a sonic tube and may be further configured to perform a heat dissipation function for the IC by vibrating air through the sonic tube in synchronization with the low-frequency band signal.

The low-frequency band signal may be harmonic with the sound signal.

The threshold frequency may be 100 Hz.

The electronic device may include a main board, and the IC, the sonic vibrator, and the processor may be disposed on the main board.

In accordance with an aspect of the disclosure, there is provided a control method of an electronic device, the control method including: outputting a sound signal through a speaker; and filtering a low-frequency band signal that is less than or equal to a threshold frequency from the sound signal and providing the low-frequency band signal to a sonic vibrator.

The filtering may include: filtering the low-frequency band signal from the sound signal using a low pass filter; amplifying the low-frequency band signal to generate an amplified low-frequency band signal using an amplifier; and providing the amplified low-frequency band signal to the sonic vibrator.

The control method may include: amplifying the sound signal to generate an amplified sound signal using a sound amplifier connected to the speaker; and providing the amplified sound signal to the speaker and the low pass filter.

The amplifying the sound signal may include: controlling an amplification factor according to a volume adjustment command of a user, and a magnitude of the low-frequency band signal may be identified based on the amplification factor of the sound amplifier.

The electronic device may include a temperature sensor arranged on one side of the IC, and the providing the amplified low-frequency band signal to the sonic vibrator may include controlling an amplification factor of the amplifier based on temperature information generated by the temperature sensor.

The sonic vibrator may be spaced apart from the IC by a predetermined distance in a first direction.

The control method may further include performing a heat dissipation function for the IC by vibrating air, using the sonic vibrator, through a sonic tube in synchronization with the low-frequency band signal.

The low-frequency band signal may be harmonic with the sound signal.

The threshold frequency may be 100 Hz.

The IC and the sonic vibrator may be included in a main board of the electronic device.

In accordance with an aspect of the disclosure, there is provided a processing apparatus including: a sonic vibrator; a memory storing instructions; and at least one processor configured to execute the instructions to: identify an amplification factor; and apply a signal to the sonic vibrator based on the amplification factor.

The at least one processor may be further configured to execute the instructions to identify the amplification factor based on a type of processing performed by the at least one processor.

The processing apparatus may include a temperature sensor, and the at least one processor may be further configured to execute the instructions to identify the amplification factor based on temperature information generated by the temperature sensor.

The at least one processor may be further configured to execute the instructions to access a look-up table stored in the memory based on the temperature information and identify the amplification factor based on the look-up table.

The at least one processor may be further configured to execute the instructions to identify the amplification factor based on at least one from among a type of reproduced content, a type of provided user interface, a number of components currently operating, a communication state of the processing apparatus, an operation mode of the processing apparatus.

BRIEF DESCRIPTION OF THE DRAWINGS

The above and other aspects, and advantages of certain embodiments of the disclosure will be more apparent from the following description taken in conjunction with the accompanying drawings, in which.

The same reference numerals are used to represent the same (or similar) elements throughout the drawings.

DETAILED DESCRIPTION

One or more embodiments of the present disclosure will be further described with reference to the attached drawings.

Expressions such as "have," "may have," "include," "may include" or the like represent presence of a corresponding feature (for example: components such as numbers, functions, operations, or parts) and do not exclude the presence of additional features.

The expression "At least one of A or/and B" should be understood to represent "A," "B" or "A and B".

As used herein, the terms "first," "second," or the like may use corresponding components, regardless of importance of order and are used to distinguish a component from another without limiting the components.

In addition, the description in the disclosure that one element (e.g., a first element) is "(operatively or communicatively) coupled with/to" or "connected to" another element (e.g., a second element) should be interpreted to include both the case that the one element is directly coupled to the another element, and the case that the one element is coupled to the another element through still another element (e.g., a third element).

A singular expression includes a plural expression, unless otherwise specified. It is to be understood that the terms such as "comprise" or "consist of" are used herein to designate a presence of a characteristic, number, step, operation, element, component, or a combination thereof, and not to preclude a presence or a possibility of adding one or more of other characteristics, numbers, steps, operations, elements, components or a combination thereof.

A term such as "module," "unit," "part," and so on is used to refer to an element that performs at least one function or operation, and such element may be implemented as hardware or software, or a combination of hardware and software. Further, other than when each of a plurality of "modules," "units," "parts," and the like must be realized in an individual hardware, the components may be integrated in at least one module or chip and be realized in at least one processor.

Hereinafter, embodiments of the disclosure will be described in detail with reference to the accompanying drawings.

Figure 1:
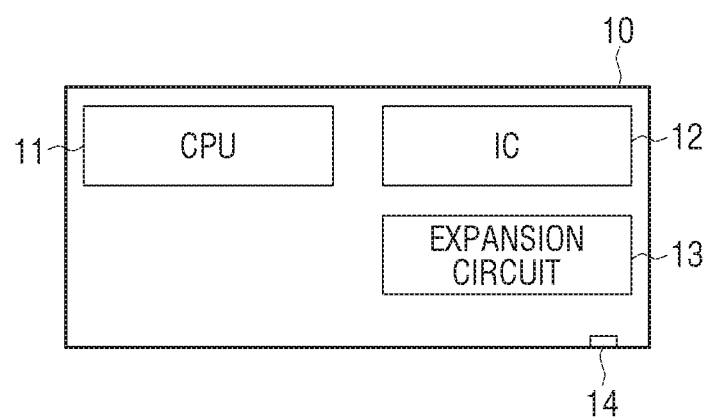
FIG. 1 is a view provided to describe a structure of a main board of an electronic device according to an embodiment.

FIG. 1 is a view provided to describe a structure of a main board of an electronic device according to an embodiment.

A main board (or motherboard) 10 is a substrate on which a basic component of the electronic device is mounted.

According to an embodiment, the main board 10 may include a central processing unit (CPU) 11, an integrated circuit (IC) 12, an expansion circuit 13, and an output terminal 14, as illustrated in FIG. 1.

The CPU 11 analyzes and calculates a command received from a user, and then outputs the result. Recently, it is frequent that the CPU, a graphics processing unit (GPU), a controller for various devices, or the like, are included in a single chip. In particular, an integrated processor mainly used in a small device such as a smartphone may be referred to as a system on a chip (SoC), an application processor (AP) or an accelerated processing unit (APU).

According to an embodiment, the main board 10 may include a CPU socket, and the CPU 11 may be installed in the CPU socket.

The IC 12 is a key chip for controlling overall functions of the main board, and is also referred to as a chipset. The IC 12, in which several microchips and circuits are gathered, controls an entire system in hardware. The IC 12 is a key component which controls the bus, and input/output, and most of the main boards use a peripheral component interconnect (PCI) bus.

The expansion circuit (or the expansion chip or expansion card) 13 may include at least one of a graphic card for outputting a screen to a monitor, a sound card for transferring sound to a speaker, a LAN card for transceiving (transmitting and receiving) data through connection to a network, a storage device, or a controller card that generates a specific expansion terminal. According to an example, a sound card (or an audio card) may perform sound processing to output sound through a speaker connected to the main board 10. In addition, the sound card allows recording of sound input through a microphone connected to the electronic device, and may process sound stored on a disk. According to one embodiment, the sound card may be implemented as a digital signal processor (DSP) that performs digital sound processing.

An output terminal 14 may include various video/audio output ports such as a universal serial bus (USB) port, d-subminiature (D-SUB), digital visual interface (DVI)-D, high definition multimedia interface (HDMI), Sony/Philips Digital Interconnect Format (S/PDIF), PS/2, serial port, parallel port, or the like.

In addition, the main board may further include a memory slot, a storage device port, or the like.

Because the IC 12 performs various roles while controlling the overall functions of the main board, the IC 12 may generate excess heat, and a heat dissipation function may be used to dissipate the generated heat. Various embodiments of performing a heat dissipation function with respect to the IC 12 using a sound signal will be described below.

Figure 2A:
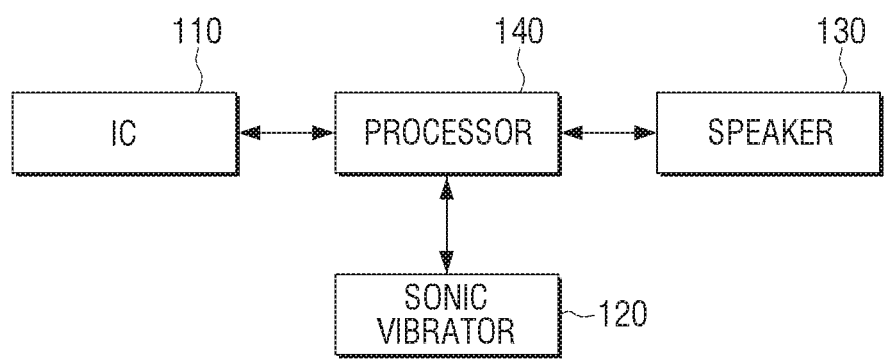
FIGS. 2A and 2B are block diagrams of an electronic device according to an embodiment.
Figure 2B:
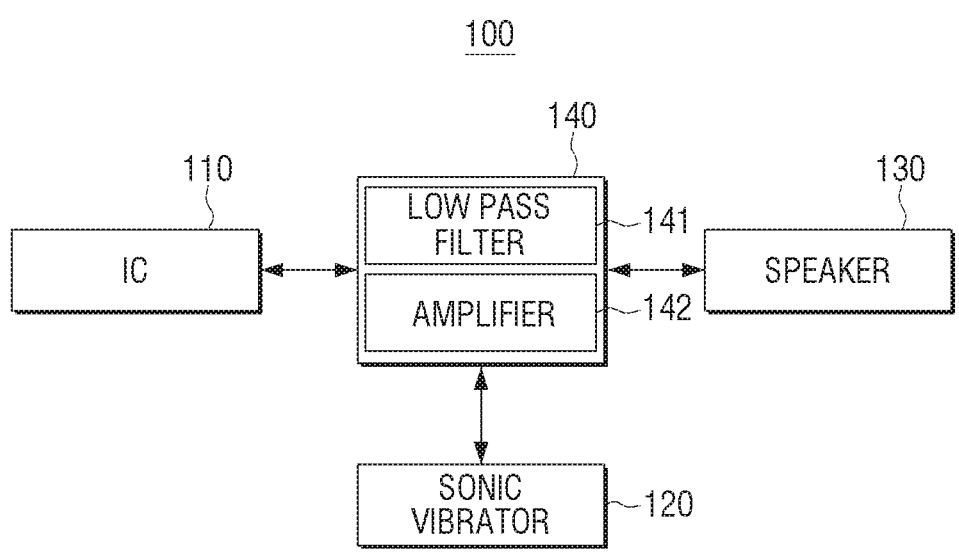

FIGS. 2A and 2B are block diagrams illustrating configurations of an electronic device according to one or more embodiments.

Referring to FIG. 2A, an electronic device 100 includes an integrated circuit (IC) 110, a sonic vibrator 120, a speaker 130, and a processor 140. According to an embodiment, the IC 110, the sonic vibrator 120, the speaker 130, and the processor 140 may be provided in the main board.

The electronic device 100 may be implemented as a sound output device including at least one speaker. For example, the electronic device 100 may be implemented in diverse devices to output sound, such as a smart TV, a user terminal device, a PC, a home appliance, a medical device, an audio device, a sound bar, a home theater system, an one box speaker, a room speaker, or the like. According to one or more embodiments, the electronic device 100 may not include a speaker, and may instead have a sound output terminal capable of outputting a sound signal to an external speaker.

The IC 110 may be a circuit chip provided in the electronic device 100 for controlling a function of the electronic device. According to one embodiment, the IC 110 may be implemented as a chipset that is provided on the main board for controlling the overall functions of the main board as described with reference to FIG. 1. However, embodiments are not limited thereto, and the IC 110 may be another element that generates heat and is provided in the electronic device 100. For example, the CPU 11 as described with reference to FIG. 1 may be an example of an IC that generates heat why may be dissipated by a heat dissipation function through the sonic vibrator 120.

The sonic vibrator 120 may be arranged on one side of the IC 110.

According to an example, the sonic vibrator 120 may be spaced apart from the IC 110 by a predetermined distance in a lower direction, but embodiments are not limited thereto. The sonic vibrator 120 may be arranged adjacent to the IC 110 in various directions within a predetermined distance range.

Here, at least one of the arrangement direction of the sonic vibrator 120 or the distance with the IC 110 may be determined in a diverse manner based on the arrangement position of the IC 110 in the main board, arrangement position of another element, a relation between the arrangement position of the IC 110 with the arrangement position of another element (spacing distance, spacing direction, etc.), the implementation form of the IC 110, the heat generation characteristics of the IC 110, or the like. Alternatively, the arrangement direction of the sonic vibrator 120 and the distance with the IC 110 may be determined in consideration of the frequency band of the low-frequency band signal filtered by the processor 140, the maximum level of the low-frequency band signal, or the like.

The sonic vibrator 120 is an element that generates vibration based on a sound signal (that is, an electric signal of sound). According to one embodiment, the sonic vibrator 120 may be able to vibrate air through a sonic tube in synchronization with a low-frequency band signal. Here, the sonic tube may be implemented, for example, in a form of a nozzle. Accordingly, air may be vibrated through the sonic tube in the form of a nozzle with a low-frequency band signal to forcibly make convection current, and the IC 110 may be air-cooled therethrough.

The speaker 130 functions to output a signal processed by the processor 140.

The speaker 130 may include at least one speaker according to an implementation example of the electronic device 100. For example, the speaker 130 may include an L channel speaker and an R channel speaker that reproduce an L channel and an R channel, respectively. The embodiments are not limited thereto, and it is possible that the speaker 130 is implemented as a sound bar to reproduce the L channel, the R channel, and a center channel.

The speaker 130 has a function of converting electric pulses into sound waves, and may be implemented as a dynamic type that is classified according to a principle and a method of converting an electric signal into a sound wave. However, embodiments are not limited thereto, and the speaker 130 may be implemented as an electrostatic type, a dielectric type, a magnetostrictive type, or the like, within the scope of the disclosure.

According to an embodiment, the speaker 130 may be implemented as a full range speaker that is designed to reproduce almost all sound ranges of the audible frequency. For example, the full range speaker may reproduce the sound range of 1 Hz to 22 KHz.

According to another embodiment, the speaker 130 may be implemented to include at least one of a tweeter speaker for reproducing a high-frequency sound range, a midrange speaker for reproducing a mid-frequency sound range, or a woofer speaker for reproducing a low-frequency sound range.

The processor 140 according to an embodiment may be implemented with a digital signal processor (DSP), a microprocessor, and a time controller (TCON) which process a digital image signal, but embodiments are not limited thereto. The processor 140 may include one or more among a central processing unit (CPU), a micro controller unit (MCU), a micro processing unit (MPU), a controller, an application processor (AP), a communication processor (CP), and an advanced reduced instruction set computing (RISC) machine (ARM) processor or may be defined as a corresponding term. The processor 140 may be implemented in a system on chip (SoC) type or a large scale integration (LSI) type which a processing algorithm is built therein or in a field programmable gate array (FPGA) type. The processor 140 may perform various functions by executing computer executable instructions stored in the memory 170.

The processor 140 may output the sound signal through the speaker 130 and may filter a low-frequency band signal less than or equal to a threshold frequency from the sound signal to provide the filtered sound signal to the sonic vibrator 120. According to an embodiment, the processor 140 may output a sound signal through an input and output interface provided in the electronic device 100, instead of the speaker 130. In this case, the input and output interface may be connected to an external device such as a user terminal device or an external speaker device, and the corresponding sound signal may be output through an external device.

To be specific, the processor 140 may signal-process the input sound signal. For example, the sound signal may be input by streaming or downloading from an external device (for example, a source device), an external storage medium (for example, universal serial bus (USB)), an external server (for example, a web server, etc.) through the communication methods such as AP-based Wi-Fi (wireless LAN network), Bluetooth, Zigbee, wired/wireless local area network (LAN), wide area network (WAN), Ethernet, IEEE 1394, high definition multimedia interface (HDMI), universal serial bus (USB), mobile high-definition link (MHL), advanced encryption standard (AES)/European broadcasting union (EBU), optical, coaxial, or the like.

Here, the sound signal may be a digital sound signal, but embodiments are not limited thereto. The digital sound signal is obtained by encoding an analog signal, and may be transmitted using a certain transmission format corresponding to a protocol.

For example, the digital sound signal may be a signal form in which the analog sound signal is modulated according to a pulse code modulation (PCM) method. A method of converting an analog signal having temporal continuity into a temporally discrete signal is called the PCM method. Specifically, a method of sampling an analog signal to generate a pulse amplitude modulation (PAM) signal, quantizing a sampled value (amplitude) of the PAM signal, that is, a discrete signal, and encoding the signal into a binary or multiple bit string (digital signal) is referred to as the PCM method. That is, the transmitting side performs sampling of the analog sound signal to convert the signal into the PAM signal, quantizes each sampled pulse of the PAM signal, converts it into a code, and transmits the PCM signal. Accordingly, the electronic device 100 decodes the received sound signal (i.e., the PCM signal) to convert into the PAM signal, and interpolates the sound signal to obtain an original input signal.

When the input sound signal is a time domain signal, the processor 140 may convert the time domain signal into a frequency domain signal. For example, the processor 140 may decode a sound signal (for example, the PCM signal) received from the outside to obtain the PAM signal, and then convert the signal to the frequency domain signal.

The processor 140 may filter the low-frequency band signal that is less than or equal to a threshold frequency from the frequency band signal and provide the signal to the sonic vibrator 120.

The processor 140 may signal-process the frequency domain signal and output the processed signal through the speaker 130. For example, the processor 140 may convert the signal-processed digital signal into an analog signal, amplify, and output the signal. In addition, the processor 140 may perform various signal processing such as effects, sound field characteristics, or the like, and may also use an over-sampling technique to prevent deterioration of sound quality during conversion between digital signal and analog signal through a sample rate converter (SRC).

The processor 140 may perform signal processing based on a type of the speaker 130. For example, when the speaker 130 includes a woofer speaker, a signal of the corresponding frequency band may be filtered and output through the speaker 130, and may be provided to the sonic vibrator 120 at the same time.

Referring to FIG. 2B, according to an embodiment the processor 140 may include a low pass filter 141 and an amplifier 142. When the processor 140 is implemented as a digital signal processing (DSP) chip, the low pass filter 141 and the amplifier 142, according to an embodiment, may be integrated into the DSP chip and implemented. According to another embodiment, the low pass filter 141 and the amplifier 142 may be implemented in hardware separately from the DSP chip. According to still another embodiment, the amplifier 142 may be implemented to include the function of the low pass filter 141.

The low pass filter 141 may filter a low-frequency band signal from the sound signal that is output through the speaker 130. The low pass filter 141 may be implemented as at least one of a passive filter composed of passive elements such as resistors, inductors, capacitors, or the like, an active filter composed of passive elements (e.g., a capacitor and a resistor) and an operational amplifier with amplification action, a switched capacitor filter in which resistors are replaced with switched capacitors in an active filter circuit including the operational amplifier and capacitor, and resistor, or a digital filter that converts a signal voltage to a digital value and performs filtering by digital operation. According to an example, the low pass filter 141 may be implemented as a digital filter in the DSP chip.

Figure 3:
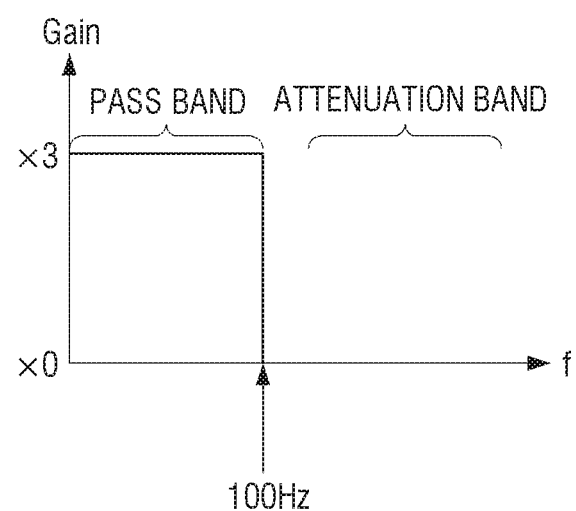
FIG. 3 is a view provided to describe operation of a low pass filter according to an embodiment.

FIG. 3 is a view provided to describe an operation of a low pass filter according to an embodiment.

As illustrated in FIG. 3, the low pass filter may be implemented to pass a signal of a band that is less than or equal to a predetermined threshold frequency and attenuate (or block) a signal of a band that exceeds the predetermined threshold frequency. For example, a cutoff frequency of the low pass filter 141 may be 100 Hz, but the frequency is not limited to the numerical value, and may be determined within a predetermined threshold range based on 100 Hz. Here, the cutoff frequency represents a boundary point of a frequency band through which a signal passes and a frequency band through which a signal may not pass.

The amplifier 142 may amplify a signal filtered by the low pass filter 141.

The amplifier 142 may be implemented as a low-frequency amplifier for amplifying a low-frequency signal. For example, the amplifier 142 may be implemented as at least one of an RC-coupled amplifier, an impedance-coupled amplifier, a transformer-coupled amplifier, or a tuning-coupled amplifier according to a load coupling scheme. The amplifier 142 may also be implemented as at least one of power amplifier or voltage amplifier. According to one embodiment, the amplifier 142 may be implemented as a digital amplifier in the DSP chip. According to one embodiment, the amplifier 142 may be implemented to include the function of the low pass filter 141.

The processor 140 may determine the amplification factor of the amplifier 142 based on the temperature information of the IC 110. For example, the electronic device 100 may further include a temperature sensor disposed on one side of the IC 110. The temperature sensor may be attached on the IC 110 on one side of the IC 110, or arranged to be spaced apart from the IC 110.

The processor 140 may adjust the amplification of the low-frequency band signal based on the temperature information sensed by the temperature sensor. For example, the processor 140 may increase the amplification factor when the sensed temperature information is relatively high, and decrease the factor of the amplification when the sensed temperature information is relatively low. According to one embodiment, the optimal factor of the amplification according to the temperature information may be calculated by an experiment or the like and stored in a look-up table form. Alternatively, it is possible to calculate the factor of amplification by using an algorithm for calculating an optimal amplification factor according to temperature information.

According to another embodiment, the processor 140 may calculate the temperature information of the IC 110 based on an amount, a type, or the like, of processing performed in the IC 110. For example, the temperature information of the IC 110 may be calculated based on a type of reproduced content, a type of provided UI, a type and number of components (for example, a sensor, etc.) which are currently operating, a communication state, an operation mode of the electronic device 100 or IC 110, or the like. The temperature information corresponding to the information may be calculated by an experiment or the like and stored in a look-up table form, or calculated using an algorithm capable of predicting temperature information based on the corresponding information.

The processor 140 may additionally perform various acoustic processing such as decoding, noise filtering, rendering, mixing, or the like.

According to an embodiment, the sound generated from the sonic vibrator 120 is a signal which is harmonic with a sound output from the speaker 130, and may have an effect of performing an auxiliary sound field function such as a woofer, inside the set of the electronic device 100.

In addition, the vibration intensity of the sonic vibrator 120 is interworked with the level of the sound signal output through the speaker 130, and there is an effect that extraneous noise is not generated even at low sound.

Figure 4A:
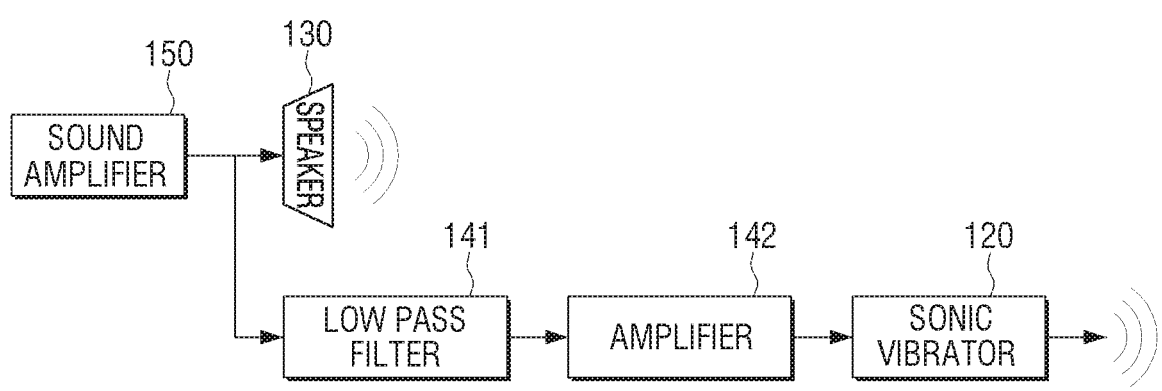
FIG. 4A is a view provided to describe an operation according to an embodiment.
Figure 4B:
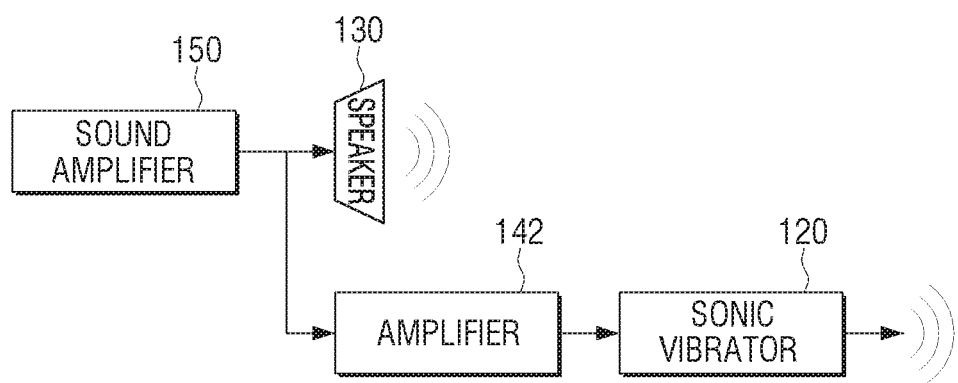
FIG. 4B is a view provided to describe an operation according to an embodiment.

FIGS. 4A and 4B are views provided to describe an operation according to an embodiment.

Referring to FIG. 4A, the electronic device 100 includes the sonic vibrator 120, the speaker 130, the low pass filter 141, the amplifier 142, and a sound amplifier 150.

The sound amplifier 150 performs a function to amplify a sound signal. The sound signal input to the sound amplifier 150 may be a signal for which various acoustic processing is performed with respect to the input sound signal.

In addition, the sound amplifier 150 may function to adjust the sound volume and the sound color of the sound signal. The sound amplifier 150 may include at least one of a pre-amplifier, a power amplifier, or an integrated amplifier. The pre-amplifier functions to properly amplify a weak signal output from a source device such as a turntable, a microphone, a musical instrument, or the like, before transmitting the signal to the power amplifier. The power amplifier functions to convert the pre-amplifier signal into a large energy signal enough to transfer the pre-amplifier signal to the speaker. The integrated amplifier may perform all functions of the pre-amplifier and the power amplifier.

The sound amplifier 150 may be implemented as at least one of an RC-coupled amplifier, an impedance-coupled amplifier, a transformer-coupled amplifier, or a tuning-coupled amplifier according to a load coupling scheme. The sound amplifier 150 may also be implemented as at least one of power amplifier or voltage amplifier. According to one embodiment, the sound amplifier 150 may be implemented as a digital amplifier in the DSP chip.

As illustrated in FIG. 4A, the sound signal amplified through the sound amplifier 150 may be provided to the low pass filter 141 and the speaker 130 at the same time. That is, the sound signal amplified through the sound amplifier 150 may be provided to the speaker 130 for outputting and the low pass filter 141 that generates a signal for heat dissipation function, in a parallel manner.

The low pass filter 141 filters the low-frequency band signal from the sound signal output from the sound amplifier 150 and provides the signal to the amplifier 142.

The amplifier 142 may amply the sound signal output from the low pass filter 141 and provide the same to the sonic vibrator 120.

In the meantime, the processor 140 may adjust the amplification factor of the sound amplifier 150 according to a volume adjustment command of a user. Accordingly, the factor of the low-frequency band signal provided to the sonic vibrator 120, also, may be determined based on the amplification factor of the sound amplifier. In this case, the vibration intensity of the sonic vibrator 120 is interworked with the level of the sound signal output through the speaker 130 and thus, there is an effect that extraneous noise is not generated even at low sound.

In this case, the sonic vibrator 120 performs a heat dissipation function for the IC 110 by vibrating air through the sonic tube in synchronization with the low-frequency band signal.

Additionally, the level of the low-frequency band signal provided to the sonic vibrator 120 may be determined based on the amplification operation of the amplifier. In other words, the processor 140 may determine the factor of the amplification operation of the amplifier 142, that is, the amplification factor of the low-frequency band signal, based on various factors. For example, the processor 140 may determine the factor of amplification of the amplifier 142 based on the temperature information of the IC 110.

Referring to FIG. 4B, the electronic device 100 includes the sonic vibrator 120, the speaker 130, the amplifier 142, and the sound amplifier 150.

According to an embodiment, the speaker 130 may include a woofer speaker, which may be embedded in the electronic device 100. In this case, the electronic device 100 may be equipped with a power amplifier embedded with a low pass filter function. For example, the sound amplifier 150 may be implemented with a power amplifier embedded with a low pass filter function.

In this case, the sound amplifier 150 filters the low-frequency band signal to be provided from the input sound signal to the woofer speaker of the speaker 130. The processor 140 may provide the low-frequency band signal filtered from the power amplifier to the woofer speaker 130 and the amplifier 142 at the same time. That is, in a corresponding embodiment, the function of the low pass filter 141 of the disclosure may be performed in the sound amplifier 150.

According to still another embodiment, if the sound signal output from the sound amplifier 150 is a signal that is adequately amplified, the signal may be directly provided to the sonic vibrator 120, without going through the amplifier 142. That is, according to an embodiment, the amplifier 142 is not included in the electronic device 100.

Figure 5:
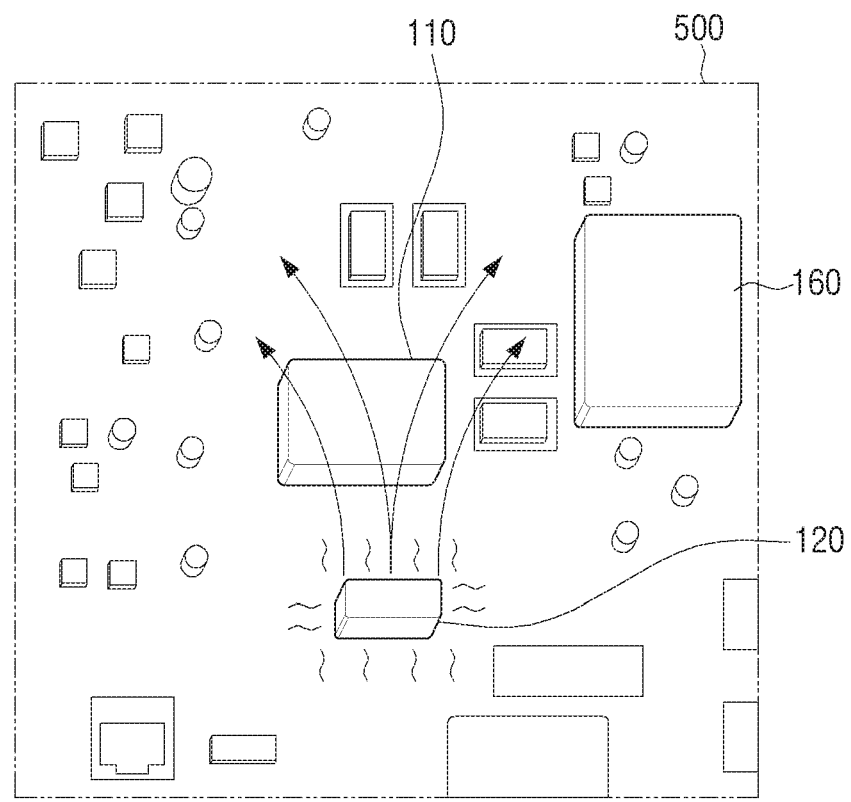
FIG. 5 is a view illustrating an arrangement of an integrated circuit (IC) and the sonic vibrator according to an embodiment.

FIG. 5 is a view illustrating an arrangement relation between an IC 110 and a sonic vibrator 120 according to an embodiment.

FIG. 5 illustrates the main board configuration according to an embodiment. According to one embodiment of the disclosure, the sonic vibrator 120 may be arranged at a predetermined distance in a lower direction of the IC 110. When the sonic vibrator 120 vibrates in a lower side of the IC 110, the air is vibrated to forcedly generate convection current, and the IC 110 may be air-cooled therethrough.

However, this is merely exemplary, and the sonic vibrator 120 may be arranged adjacent to the IC 110 in various directions within a predetermined distance range. At least one of the arrangement direction of the sonic vibrator 120 or the distance with the IC 110 may be determined in a diverse manner based on the position of the IC 110 in the main board, an arrangement position of another element, a relation between the arrangement position of the IC 110 with the arrangement position of another element (spacing distance, spacing direction, etc.), the implementation form of the IC 110, the heat generation characteristics of the IC 110, or the like.

According to another embodiment, the sonic vibrator 120 may be arranged around various heat generating elements, for example, a central processing unit (CPU) 160, in the main board, in addition to the IC 110.

FIGS. 6, 7A, 7B, and 7C are views provided to describe a characteristic of a low-frequency band signal according to an embodiment.

Figure 6:
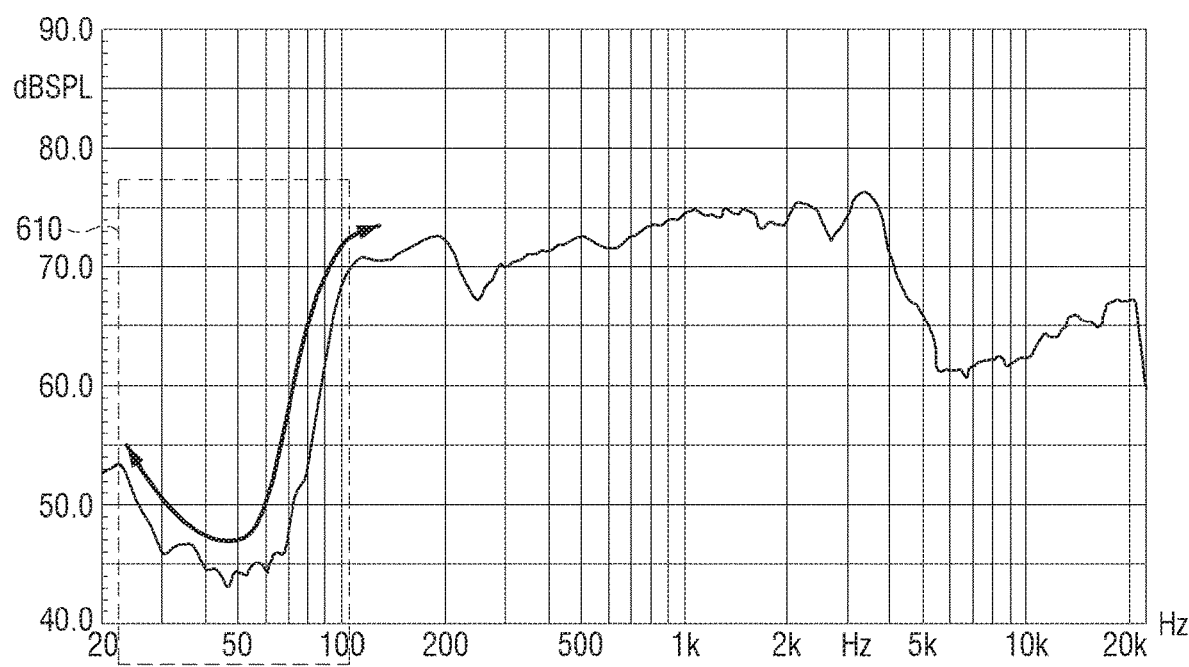
FIG. 6 is a view provided to describe a characteristic of a low-frequency band signal according to an embodiment.

As illustrated in FIG. 6, the low-frequency band signal according to an embodiment may not be a constant frequency signal but a fluctuating frequency signal which varies with time. The low-frequency band signal may be a signal which is harmonic with a sound signal output through the speaker 130.

Figure 7A:
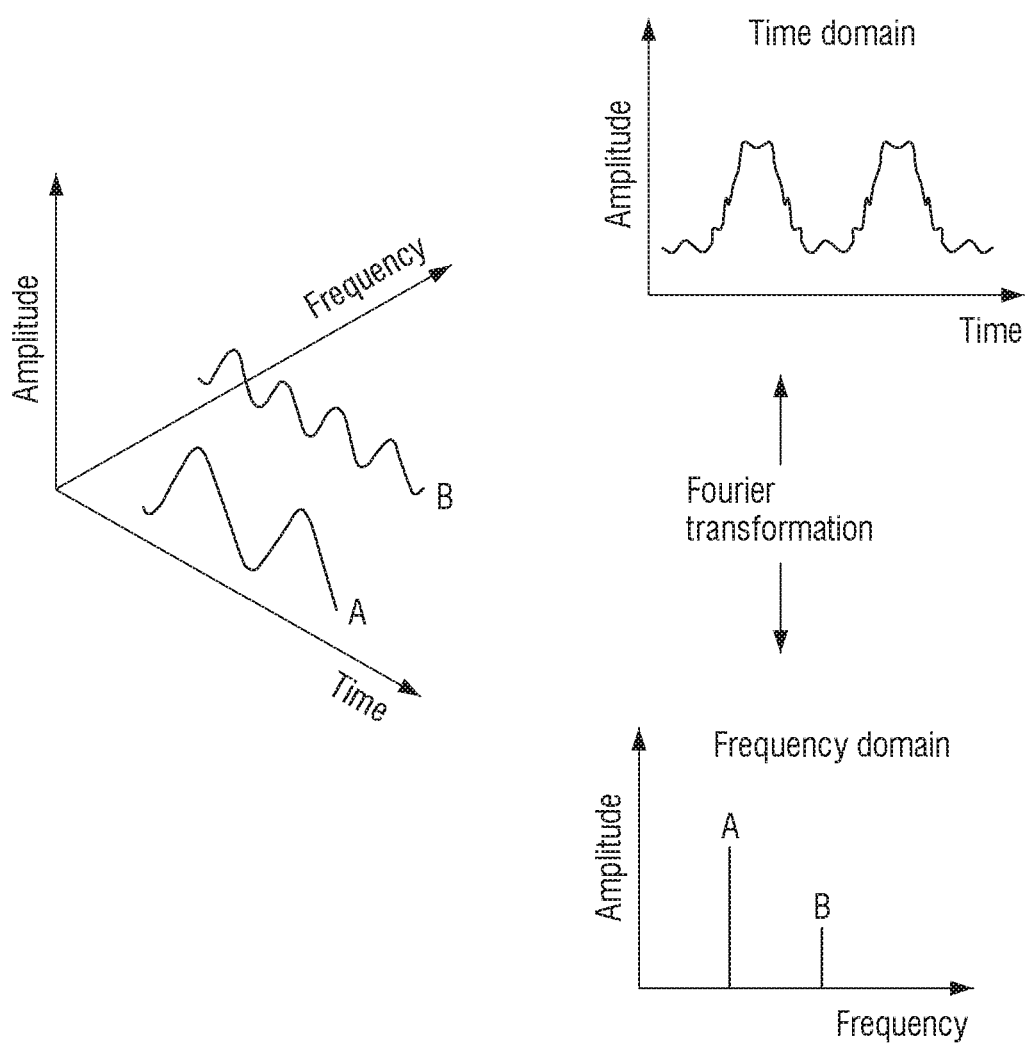
FIGS. 7A, 7B, and 7C are views provided to describe a characteristic of a low-frequency band signal according to an embodiment.

The sound signal may be a composite wave form in which a plurality of signals A and B having different frequencies are synthesized as shown in FIG. 7A. If the sound signal is converted into a frequency domain, it is represented as the lower right side. In this frequency domain, the low-frequency band signal may be filtered by applying the low pass filter.

Figure 7B:
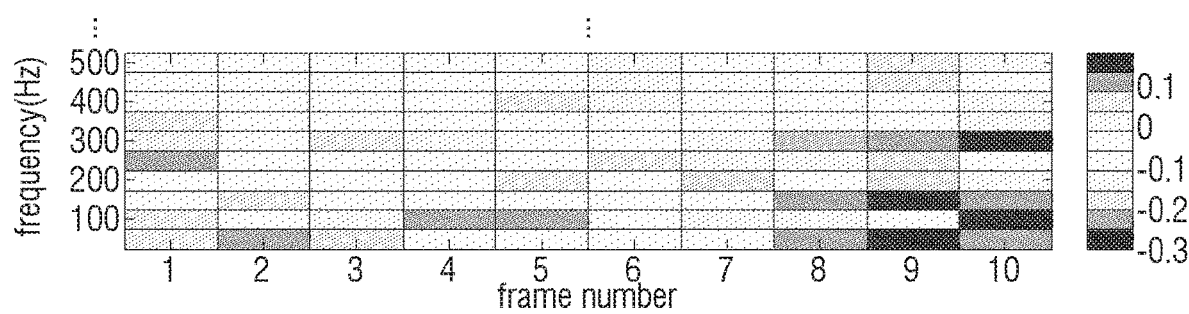

FIG. 7B is a view illustrating a frequency distribution included in each frame of a signal in the frequency domain and a magnitude of each frequency after a fast Fourier transform (FFT) conversion of a sound signal according to an embodiment.

According to FIG. 7B, a horizontal axis represents each frame arranged as a time sequence, and a vertical axis represents a frequency component of each frame. For convenience of description, each frequency (Hz) is divided in a unit of 100 Hz, the frequencies are divided into a plurality of levels, and the levels for each frequency component of each frame are represented by different hatching. Here, if an interval including 256 samples is 1 frame, and when 48000 samples are reproduced during 1 second, the 1 frame interval is 256/48000=5.3 milliseconds (ms).

According to one embodiment, a level of low-frequency waves less than a predetermined threshold value in each frame interval, that is, only a signal having the frequency of 100 Hz or less, may be extracted and provided to the sonic vibrator 120. That is, because the sound signal output through the speaker 130 includes the same signal component as that of the low-frequency band signal provided to the sonic vibrator 120, a signal provided to the sonic vibrator 120 may be a sound signal which is harmonic with the sound signal output through the speaker 130. The sound generated by the sonic vibrator has the effect of performing an auxiliary sound field function like a woofer inside the set.

Figure 7C:
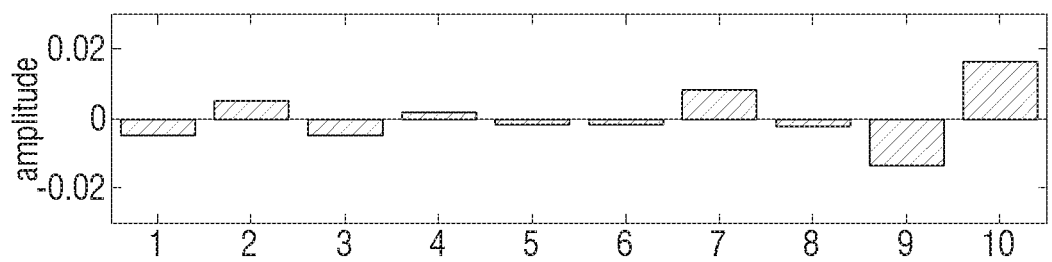

In addition, the level of a signal provided to the sonic vibrator 120 is determined by the level of a signal having a corresponding frequency value in each frame interval. As shown in FIG. 7C, the level of the sound signal output through the speaker 130 is determined based on all frequency band signals included in each frame interval, including a low-frequency signal. In other words, the level of the sound signal provided to the sonic vibrator 120 is interworked with the level of the sound signal output through the speaker 130 and thus, there is an effect that extraneous noise is not generated even in the low sound.

Figure 8:
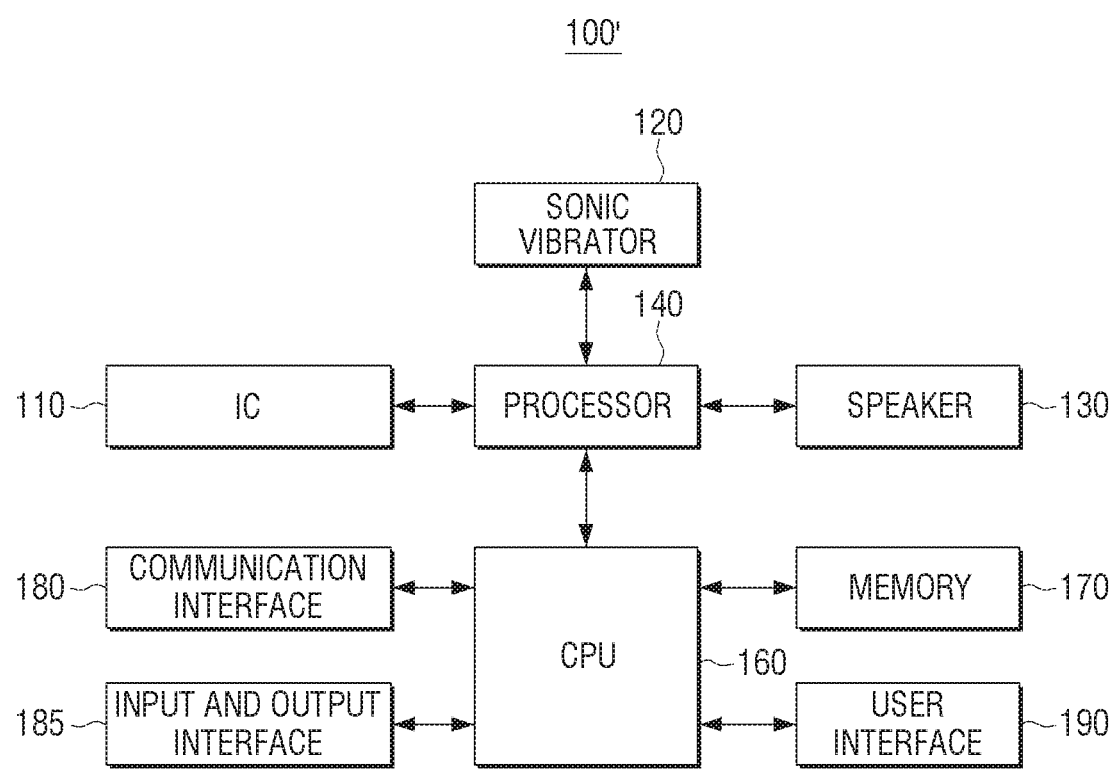
FIG. 8 is a view illustrating a detailed configuration of an electronic device according to an embodiment.

FIG. 8 is a view illustrating a detailed configuration of an electronic device according to an embodiment.

According to FIG. 8, an electronic device 100' may include the CPU 160, a memory 170, a communication interface 180, an input/output interface 185, and a user interface 190, in addition to the components of FIG. 1.

The CPU 160 performs a function to interpret and calculate a command input from a user and then output a result thereof. Accordingly, the CPU 160 is composed of a control device for interpreting a meaning of a program instruction and instructing an operation, a calculating device in charge of arithmetic and logical calculation, a register for storing data or calculation result, or the like. The CPU 160 may be connected with other devices including a main memory device by a system bus. Accordingly, the CPU 160 may be an implementation example of the processor 140 as described above. According to another embodiment, the processor 140 and the CPU 160 may be separately implemented from each other, but the operation of the processor 140 may be performed by the CPU 160. According to still another embodiment, the IC 110 may be implemented as a chip including the CPU 160. Meanwhile, the IC 110 may be separately implemented from the CPU 160, as illustrated in FIG. 1.

The memory 170 may store various data required for an operation of the electronic device 100, that is, various data obtained during an operation, or the like.

For example, the memory 170 may be implemented as an internal memory such as a read-only memory (ROM) (e.g., electrically erasable programmable read-only memory (EEPROM)) and random access memory (RAM)) or may be implemented as a memory separate from the CPU 160. In this case, the memory 170 may be implemented as a memory embedded in the electronic device 100, or may be implemented as a detachable memory in the electronic device 100, according to the data usage purpose. For example, data for driving the electronic device 100 may be stored in a memory embedded in the electronic device 100, and data for an additional function of the electronic device 100 may be stored in the memory detachable to the electronic device 100. A memory embedded in the electronic device 100 may be a volatile memory such as a dynamic random access memory (DRAM), a static random access memory (SRAM), a synchronous dynamic random access memory (SDRAM), or a nonvolatile memory such as one time programmable ROM (OTPROM), programmable ROM (PROM), erasable and programmable ROM (EPROM), electrically erasable and programmable ROM (EEPROM), mask ROM, flash ROM, a flash memory (for example, NAND flash or NOR flash), a hard disk drive or a solid state drive (SSD). A memory detachably mounted to the electronic device 100 may be implemented as a memory card (for example, a compact flash (CF), secure digital (SD), micro secure digital (micro-SD), mini secure digital (mini-SD), extreme digital (xD), multi-media card (MMC), etc.), an external memory (for example, a universal serial bus (USB) memory) connectable to a USB port, or the like.

A communication interface 180 is a configuration to communicate with various types of external devices according to various communication types. The communication interface 180 includes a Wi-Fi module, a Bluetooth module, an infrared communication module, a wireless communication module, or the like. Here, each communication module may be implemented as at least one hardware chip format. For example, the sound signal applied to the embodiment may be transceived through the communication interface 180.

The Wi-Fi module and Bluetooth module perform communication by Wi-Fi method and Bluetooth method, respectively. When using the Wi-Fi module or Bluetooth module, various connection information such as a service set identifier (SSID), a session key, or the like may be transceived first, communication is established using the connection information, and then various information may be transceived.

The communication interface 180 may include at least one of a local area network (LAN) module, Ethernet module, or wired communication module which performs communication using a pair cable, a coaxial cable, an optical fiber cable, or the like.

The electronic device 100 may further include a tuner and a demodulator, according to an implementation example.

The tuner may receive a radio frequency (RF) broadcast signal by tuning a channel selected by a user or all the prestored channels, among the RF broadcast signal received through an antenna.

The demodulator may receive and demodulate a digital intermediate frequency (DIF) signal converted by the tuner and perform channel decoding, or the like.

An input and output interface 185 may be any one of high definition multimedia interface (HDMI), mobile high-definition link (MHL), universal serial bus (USB), display port (DP), Thunderbolt, video graphics array (VGA) port, red-green-blue (RGB) port, D-subminiature (D-SUB), and digital visual interface (DVI).

The input and output interface 185 may input and output at least one of an audio signal and a video signal. According to an implementation example, the input and output interface 185 may include a port which only inputs and outputs an audio signal and a port which only inputs and outputs a video signal separately, or a single port which inputs and outputs both an audio signal and a video signal.

According to one embodiment, a sound signal may be provided to an external device having a speaker through at least one of the communication interface 180 or the input and output interface 185. For example, a sound signal may be transmitted to an external user terminal device using Bluetooth communication, or may be provided to an external speaker device via an HDMI interface. When a sound signal is output from an external user terminal device or an external speaker device located nearby, the various embodiments of the disclosure may be applied.

A user interface 190 may be implemented using a device such as a button, a touch pad, a mouse, and a keyboard, or a touch screen capable of performing the above-described display function and operation input function. Here, the button may be various types of buttons such as a mechanical button, a touch pad, a wheel, or the like, formed in an arbitrary region such as a front portion, a side portion, a back portion, or the like, of the outer surface of the main body of the electronic device 100.

The electronic device 100 is implemented as a device not including the display, and transmit an image signal to a separate display device.

According to an implementation example, the electronic device 100 may further include a display and a speaker.

The display panel may be implemented as various types of displays such as a liquid crystal display (LCD), organic light emitting diodes (OLED) display, a plasma display panel (PDP), and the like. A driving circuit of the display panel can be implemented using one or more of an a-Si TFT, a low temperature poly silicon (LTPS) TFT, an organic TFT (OTFT), and a backlight. In the meantime, the display may be implemented as a touch screen coupled with a touch sensor, a flexible display, a three-dimensional (3D) display, or the like.

According to an embodiment, a display may include not only a display panel to output an image but also a bezel that houses a display panel. In particular, the bezel according to an embodiment may include a touch sensor for sensing a user interaction.

Figure 9:
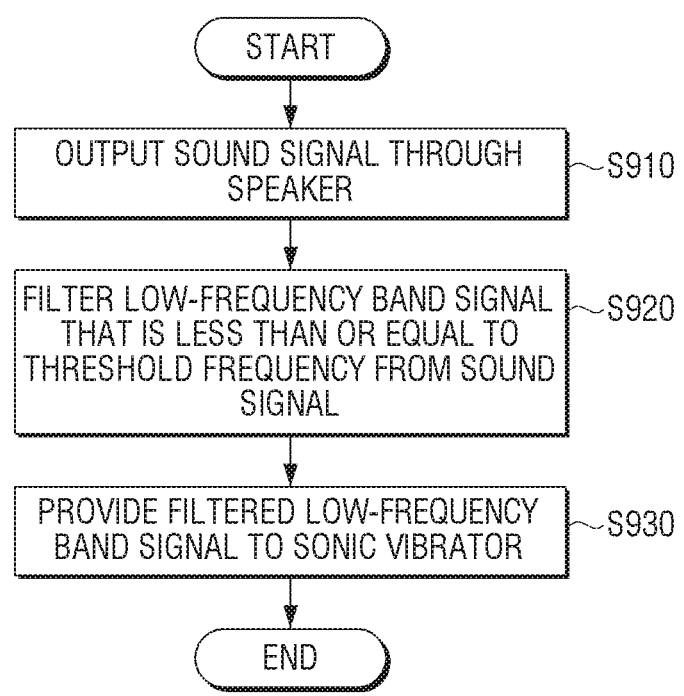
FIG. 9 is a view provided to describe a control method of an electronic device according to an embodiment.

FIG. 9 is a flowchart provided to describe a control method of an electronic device according to an embodiment.

Referring to FIG. 9, the electronic device 100 outputs a sound signal through a speaker in step S910.

The electronic device 100 filters a low-frequency band signal which is less than or equal to a threshold frequency from a sound signal output through the speaker in step S920.

The electronic device 100 provides the filtered low-frequency band signal to the sonic vibrator in step S930. Here, the sonic vibrator may be arranged at one side of the IC. For example, the sonic vibrator may be arranged to be spaced apart by a predetermined distance in the lower direction of the IC.

According to an embodiment, the IC and the sonic vibrator may be included in the main board provided in the electronic device 100.

In step S920, the low-frequency band signal may be filtered from a sound signal output through the speaker, using the low pass filter, and the filtered signal may be amplified and provided to the sonic vibrator.

The electronic device 100 may amplify the sound signal through a sound amplifier connected to the speaker, and provide the amplified sound signal to the speaker and the low pass filter.

The electronic device 100 may adjust the amplification factor of the sound amplifier according to a volume adjustment command of a user. In this case, the level of the low-frequency band signal may be determined based on the amplification factor of the sound amplifier.

The electronic device 100 may include a temperature sensor arranged on one side of the IC. In this case, in step S920, the amplification factor of the signal filtered based on the temperature information sensed by the temperature sensor may be adjusted.

The sonic vibrator may vibrate air through a sonic tube in synchronization with the provided low-frequency band signal and perform heat dissipation function for the IC.

Here, the low-frequency band signal may be a signal which is harmonic with the sound signal output through the speaker.

The low-frequency band signal may be a signal that is less than or equal to 100 Hz.

According to the various embodiments as described above, a heat dissipation function for the electronic device may be provided using the sound signal output through the speaker.

The sound generated from the sonic vibrator is a signal which is harmonic with a sound output through the speaker, and may have an effect of performing a sound field function such as a woofer inside the set.

In addition, the vibration intensity of the sonic vibrator is interworked with the level of the sound signal output through the speaker, and thus, there is an effect that extraneous noise is not generated even in low sound.

The methods according to the various embodiments as described above may be implemented as an application format installable in an existing electronic device.

The methods according to the various embodiments as described above may be implemented as software upgrade or hardware upgrade for an existing electronic device.

The various embodiments described above may be performed through an embedded server provided in an electronic device, or an external server of at least one electronic device and a display device.

Meanwhile, various embodiments of the disclosure may be implemented in software, including instructions stored on machine-readable storage media readable by a machine (e.g., a computer). An apparatus may call instructions from the storage medium, and execute the called instruction, including an electronic apparatus (for example, electronic apparatus A) according to the disclosed embodiments. When the instructions are executed by a processor, the processor may perform a function corresponding to the instructions directly or by using other components under the control of the processor. The instructions may include a code generated by a compiler or a code executable by an interpreter. A machine-readable storage medium may be provided in the form of a non-transitory storage medium. Herein, the term "non-transitory" only denotes that a storage medium does not include a signal but is tangible, and does not distinguish the case in which a data is semi-permanently stored in a storage medium from the case in which a data is temporarily stored in a storage medium.

According to an embodiment, the method according to the above-described embodiments may be included in a computer program product. The computer program product may be traded as a product between a seller and a consumer. The computer program product may be distributed online in the form of machine-readable storage media (e.g., compact disc read only memory (CD-ROM)) or through an application store (e.g., Play Store™) or distributed online directly. In the case of online distribution, at least a portion of the computer program product may be at least temporarily stored or temporarily generated in a server of the manufacturer, a server of the application store, or a machine-readable storage medium such as memory of a relay server.

According to the embodiments, the respective elements (e.g., module or program) of the elements mentioned above may include a single entity or a plurality of entities. According to the embodiments, at least one element or operation from among the corresponding elements mentioned above may be omitted, or at least one other element or operation may be added. Alternatively or additionally, a plurality of components (e.g., module or program) may be combined to form a single entity. In this case, the integrated entity may perform functions of at least one function of an element of each of the plurality of elements in the same manner as or in a similar manner to that performed by the corresponding element from among the plurality of elements before integration. The module, a program module, or operations executed by other elements according to variety of embodiments may be executed consecutively, in parallel, repeatedly, or heuristically, or at least some operations may be executed according to a different order, may be omitted, or the other operation may be added thereto.

While embodiments have been shown and described, the disclosure is not limited to the specific embodiments disclosed herein. It will be understood by those of ordinary skill in the art that various changes in form and details may be made without departing from the spirit and scope of the present disclosure as defined by the following claims and their equivalents.

What is claimed is:

1. An electronic device comprising:
an integrated circuit (IC);
a sonic vibrator arranged on one side of the IC;
a speaker; and
a processor configured to:
control the speaker based on a sound signal,
filter a low-frequency band signal that is less than or equal to a threshold frequency from the sound signal, and
control the sonic vibrator to perform a heat dissipation function for the IC by vibrating air in synchronization with the low-frequency band signal.

2. An electronic device comprising:
an integrated circuit (IC);
a sonic vibrator arranged on one side of the IC;
a temperature sensor arranged on one side of the IC,
a speaker; and
a processor configured to:
control the speaker based on a sound signal, and
filter a low-frequency band signal that is less than or equal to a threshold frequency from the sound signal and provide the low-frequency band signal to the sonic vibrator,
wherein the processor comprises:
a low pass filter configured to filter the low-frequency band signal from the sound signal; and
an amplifier to amplify the low-frequency band signal, and
wherein the processor is further configured to control an amplification factor of the amplifier based on temperature information generated by the temperature sensor.

3. The electronic device of claim 2, further comprising: a sound amplifier configured to generate an amplified sound signal based on the sound signal,
wherein the processor is further configured to provide the amplified sound signal to the speaker and the low pass filter.

4. The electronic device of claim 3, wherein the processor is further configured to:
control an amplification factor of the sound amplifier according to a volume adjustment command of a user, and
identify a level of the low-frequency band signal based on the amplification factor of the sound amplifier and the temperature information.

5. The electronic device of claim 1, further comprising a temperature sensor arranged on one side of the IC,
wherein the processor is further configured to control an amplification factor of the low-frequency band signal based on temperature information generated by the temperature sensor.

6. The electronic device of claim 1, wherein the sonic vibrator is spaced apart from the IC by a predetermined distance in a first direction.

7. The electronic device of claim 1, wherein the sonic vibrator comprises a sonic tube and is further configured to perform the heat dissipation function for the IC by vibrating air through the sonic tube in synchronization with the low-frequency band signal.

8. The electronic device of claim 1, wherein the low-frequency band signal is harmonic with the sound signal.

9. The electronic device of claim 1,
wherein the threshold frequency is 100 Hz.

10. The electronic device of claim 1, further comprising a main board,
wherein the IC, the sonic vibrator, and the processor are disposed on the main board.

11. A control method of an electronic device, the control method comprising:
outputting a sound signal through a speaker; and
filtering a low-frequency band signal that is less than or equal to a threshold frequency from the sound signal; and providing the low-frequency band signal to a sonic vibrator to control the sonic vibrator to perform a heat dissipation function for the IC by vibrating air in synchronization with the low-frequency band signal, wherein the sonic vibrator is arranged on one side of an integrated circuit (IC).

12. The control method of claim 11, wherein the filtering comprises:

filtering the low-frequency band signal from the sound signal using a low pass filter;

amplifying the low-frequency band signal to generate an amplified low-frequency band signal using an amplifier; and providing the amplified low-frequency band signal to the sonic vibrator.

13. The control method of claim 12, comprising:

amplifying the sound signal to generate an amplified sound signal using a sound amplifier connected to the speaker; and providing the amplified sound signal to the speaker and the low pass filter.

14. The control method of claim 13, wherein the amplifying the sound signal comprises:

controlling an amplification factor according to a volume adjustment command of a user, and wherein a magnitude of the low-frequency band signal is identified based on the amplification factor of the sound amplifier.

15. The control method of claim 12, wherein the electronic device comprises a temperature sensor arranged on one side of the IC, and wherein the providing the amplified low-frequency band signal to the sonic vibrator comprises controlling an amplification factor of the amplifier based on temperature information generated by the temperature sensor.

16. The control method of claim 11, wherein the sonic vibrator is spaced apart from the IC by a predetermined distance in a first direction.

17. The control method of claim 11, further comprising performing the heat dissipation function for the IC by vibrating air, using the sonic vibrator, through a sonic tube in synchronization with the low-frequency band signal.

18. The control method of claim 11, wherein the low-frequency band signal is harmonic with the sound signal.

19. The control method of claim 11, wherein the threshold frequency is 100 Hz.

20. The control method of claim 11, wherein the IC and the sonic vibrator are included in a main board of the electronic device.

* * * * *